(12) United States Patent  
Lin

(10) Patent No.: US 10,062,802 B2
(45) Date of Patent: Aug. 28, 2018

(54) EMBEDDED LED CIRCUIT BOARD AND METHOD OF MANUFACTURING THE SAME

(71) Applicant: LONGMEN GETMORE POLYURETHANE CO., LTD., Huizhou, Guangdong (CN)

(72) Inventor: Chia-Yen Lin, Huizhou (CN)

(73) Assignee: LONGMEN GETMORE POLYURETHANE CO., LTD., Guangdong (CN)

( * ) Notice: Subject to any disclaimer, the term of this patent is extended or adjusted under 35 U.S.C. 154(b) by 7 days.

(21) Appl. No.: 15/549,203

(22) PCT Filed: Mar. 4, 2016

(86) PCT No.: PCT/CN2016/075568
§ 371 (c)(1),
(2) Date: Aug. 7, 2017

(87) PCT Pub. No.: WO2016/141852
PCT Pub. Date: Sep. 15, 2016

(65) Prior Publication Data
US 2018/0040762 A1    Feb. 8, 2018

(30) Foreign Application Priority Data

Mar. 6, 2015 (CN) .......................... 2015 1 0100692

(51) Int. Cl.
*H01L 33/62* (2010.01)
*H01L 33/48* (2010.01)
(Continued)

(52) U.S. Cl.
CPC .......... *H01L 33/005* (2013.01); *H01L 33/483* (2013.01); *H01L 33/62* (2013.01);
(Continued)

(58) Field of Classification Search
CPC ...... H01L 33/005; H01L 33/62; H01L 33/483
See application file for complete search history.

(56) References Cited

U.S. PATENT DOCUMENTS

| 2003/0094622 A1* | 5/2003 | Horiuchi | H01L 33/486 257/100 |
| 2007/0096113 A1* | 5/2007 | Inoshita | H01L 33/507 257/79 |

(Continued)

FOREIGN PATENT DOCUMENTS

| CN | 201731455 U | 2/2011 |
| CN | 102214587 A | 10/2011 |

(Continued)

*Primary Examiner* — Mohsen Ahmadi
*Assistant Examiner* — Gustavo Ramallo

(57) ABSTRACT

A method of manufacturing an embedded LED circuit board, including the step of: forming a through hole in a circuit substrate, the through hole communicating a first surface and a second surface of the circuit substrate; embedding a LED in the through hole of the circuit substrate; and electrically connecting two pins of the LED with a circuit disposed on the second surface of the circuit substrate. Because the LED is disposed in the through hole of the circuit substrate, not disposed on the surface on the circuit substrate, the LED is embedded in the circuit substrate. Therefore, the thickness of the embedded LED circuit board is reduced and it is advantageous to assembling the embedded LED circuit board in the electronic devices having limited volume.

6 Claims, 9 Drawing Sheets

(51) Int. Cl.
*H01L 33/00* (2010.01)
*H05K 1/18* (2006.01)
*H05K 3/30* (2006.01)
*H05K 3/32* (2006.01)

(52) U.S. Cl.
CPC .............. *H05K 1/18* (2013.01); *H05K 3/30* (2013.01); *H05K 3/32* (2013.01)

(56) References Cited

U.S. PATENT DOCUMENTS

2008/0080181 A1* 4/2008 Yu ................... H05K 1/0274
    362/249.01
2009/0290273 A1* 11/2009 Shih ................ H01L 25/167
    361/56

FOREIGN PATENT DOCUMENTS

| CN | 102693973 A | 9/2012 |
|----|-------------|--------|
| CN | 104320871 A | 1/2015 |

\* cited by examiner

EMBEDDED LED CIRCUIT BOARD AND METHOD OF MANUFACTURING THE SAME

BACKGROUND OF THE INVENTION

1. Field of the Invention

The present invention relates generally to a circuit board and a method of manufacturing the same, and more particularly, to an embedded LED circuit board and a method of manufacturing the same.

2. The Prior Arts

FIG. 8 shows a conventional circuit board 50 having a light-emitting diode 60 (LED) mounted thereon. When assembling the LED 60, two through holes 51 are formed in the circuit board 50 first. The LED 60 is then disposed on a top surface 52 of the circuit board 50 and the two pins 61 of the LED 60 are respectively inserted through the two through holes 51 from the top surface 52 to a bottom surface 53 of the circuit board 50. Finally, the pins 61 are bended to be adjacent to the circuit board 50 and soldered to a circuit 54 disposed on the bottom surface 53 of the circuit board 50. Thus, the LED 60 is electrically connected with the circuit 54 disposed on the bottom surface 53 of the circuit board 50 and the LED 60 can be powered to emit light.

However, when using the conventional method mentioned above to assemble the LED 60 to the circuit board 50, the LED 60 is projected above the top surface 52 of the circuit board 50. Due to the thickness of the LED 60, the overall thickness of the finished product increases. Therefore, it is disadvantageous to assemble the circuit board 50 having the LED 60 mounted thereon to a compact electronic device, which has a relative small inner space. As such, a method of assembling a light-emitting diode on a circuit board is desired to be provided for providing a solution in accordance with the foregoing disadvantages of the conventional design.

SUMMARY OF THE INVENTION

A primary objective of the present invention is to provide an embedded LED circuit board and a method manufacturing the same, which prevent the overall thickness of the finished product from increasing due to assembling the LED to the circuit board.

In order to achieve the foregoing objective, a method of manufacturing an embedded LED circuit board according to the present invention includes the steps of: (1) forming a through hole in a circuit substrate, the circuit substrate including a first surface and a second surface opposite to the first surface, the through hole communicating the first surface and the second surface of the circuit substrate; (2) embedding a light-emitting diode (LED) in the through hole of the circuit substrate; and (3) electrically connect two pins of the LED with a circuit disposed on the second surface of the circuit substrate.

According to the present invention, an embedded LED circuit board manufactured by the method mentioned above includes: a circuit substrate having a first surface, a second surface opposite to the first surface, a through hole formed in the circuit substrate and communicating the first surface and the second surface, and a circuit disposed on the second surface; and a LED embedded in the circuit substrate and having two pins electrically connected with the circuit disposed on the second surface of the circuit substrate.

According to the present invention, the LED is placed in the through hole after the through hole is formed in the circuit substrate. As a result, the LED is embedded in the through hole of the circuit substrate, which can reduce the increased thickness of the embedded LED circuit board due to assembling the LED with the circuit substrate. Therefore, it is advantageous to assembling the embedded LED circuit board according to the present invention in the electronic devices having limited volume.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
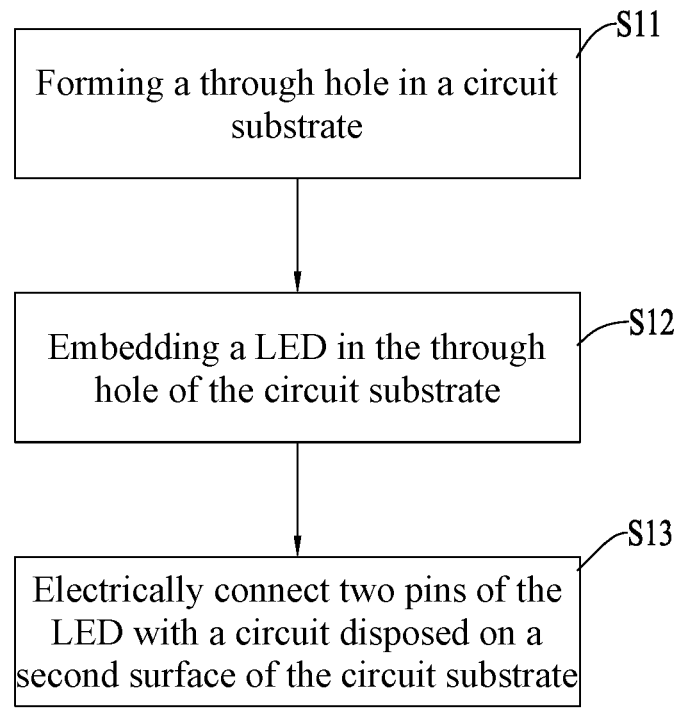
FIG. 1 is a flow chart illustrating a method of manufacturing an embedded LED circuit board according to a first embodiment of the present invention.

With reference to the drawings and in particular to FIG. 1, a method of manufacturing an embedded LED circuit board according to the present invention includes the steps of: forming a through hole 14 in a circuit substrate 10, the circuit substrate 10 including a first surface 11 and a second surface 12 opposite to the first surface 11, the through hole 14 communicating the first surface 11 and the second surface 12 of the circuit substrate 10 (S11); embedding a light-emitting diode (LED) 20 in the through hole 14 of the circuit substrate 10 (S12); and electrically connecting two pins 21 of the LED 20 with a circuit 13 disposed on the second surface 12 of the circuit substrate 10 (S13).

Figure 2A:
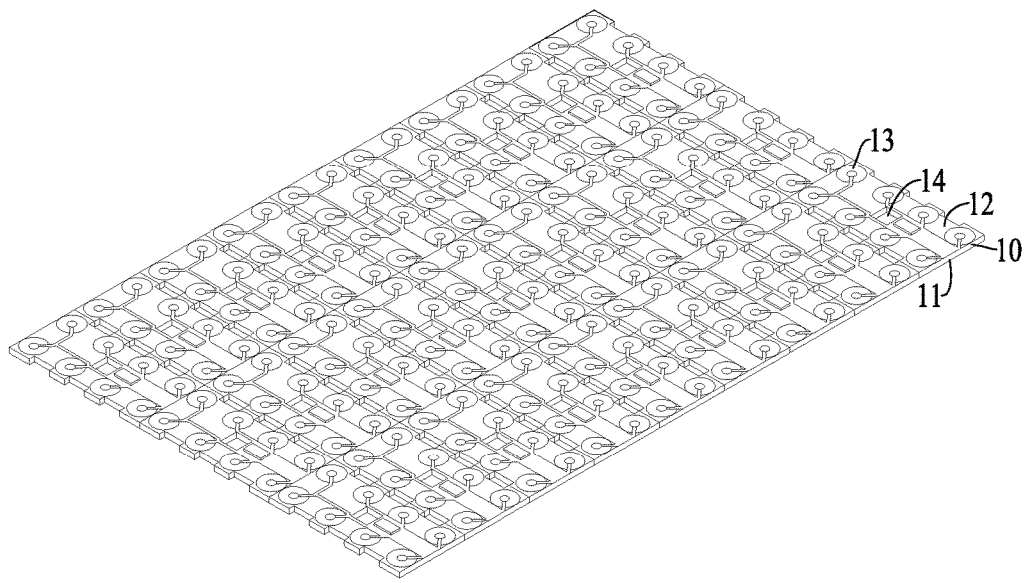
FIGS. 2A and 2B are schematic diagrams showing the method of manufacturing the embedded LED circuit board according to the first embodiment of the present invention.
Figure 2B:
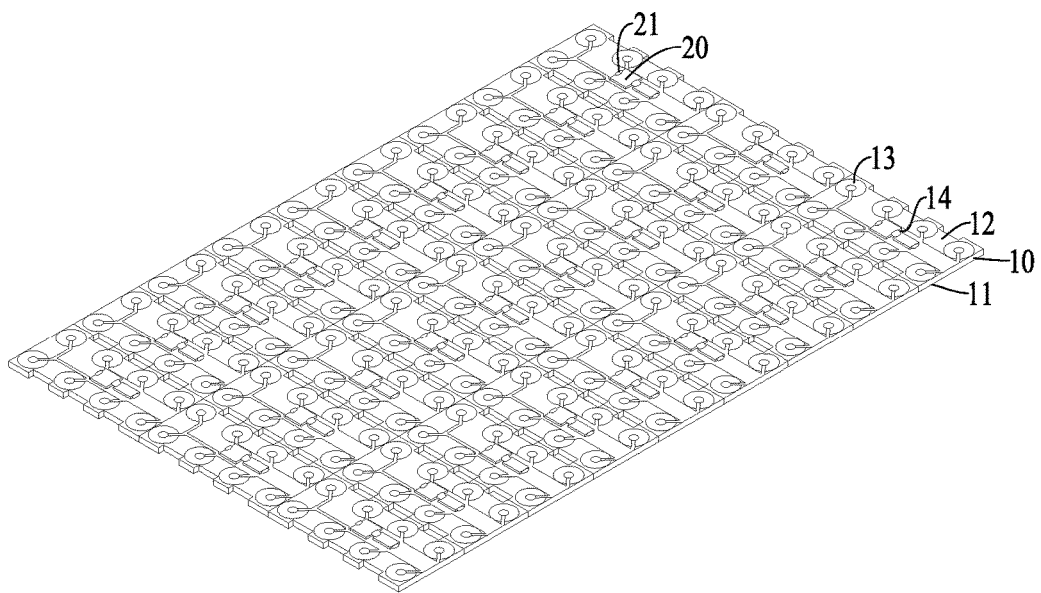

Referring to FIGS. 2A and 2B, a plurality of circuit substrates 10 are arranged in a matrix and the circuit substrates 10 are processed simultaneously to save the manufacturing time in the manufacture of embedded LED circuit boards according to the present invention. Each of the circuit substrates 10 has the first surface 11 and the second surface opposite to each other and the second surface 12 of the circuit substrate 10 is configured to include the circuit 13 disposed thereon to connect with the pins 21 of the LED 20.

FIGS. 2A and 2B illustrate the method of manufacturing the embedded LED circuit board according to a first embodiment of the present invention. As shown in FIG. 2A, in step S11, because the second surface 12 of the circuit substrate 10 has the circuit 13 disposed thereon, the first surface 11 is placed on a platform (not shown in the drawings) and the second surface faces up. Then the through hole 14 is formed in the circuit substrate 10.

As shown in FIG. 2B, in step S12 and step S13, after the LED 20 is embedded in the through hole 14 of the circuit substrate 10, the pins 21 of the LED 20 are electrically connected with the circuit 13 disposed on the second surface 12 of the circuit substrate 10. Because the second surface 12 of the circuit substrate 10 is placed facing up, the LED 20 is disposed in the through hole 14 of the circuit substrate 10 with the pins 21 facing up to allow the soldering be performed by the operating staff or the robot, thereby electrically connecting the pins 21 of the LED 10 with the circuit 13 disposed on the second surface 12 of the circuit substrate 10. The LED 20 has a light-emitting front side 22 and a no-light-emitting back side 23 opposite to the light-emitting front side 22. The pins 21 are disposed at the no-light-emitting back side 23 of the LED 20. In other words, the LED 20 is disposed in the through hole 14 with the light-emitting front side 22 facing down. According to the first embodiment, solder paste 15 is deposited over the pins 21 of the LED 20 and the circuit 13 disposed on the second surface 12 of the circuit substrate 10 by printing. Then, the LED 20 and the circuit substrate 10 is put to a tin furnace to solidify the solder paste 15, thereby soldering the pins 21 of the LED 20 with the circuit 13 disposed on the second surface 12 of the circuit substrate 10 together.

Figure 3A:
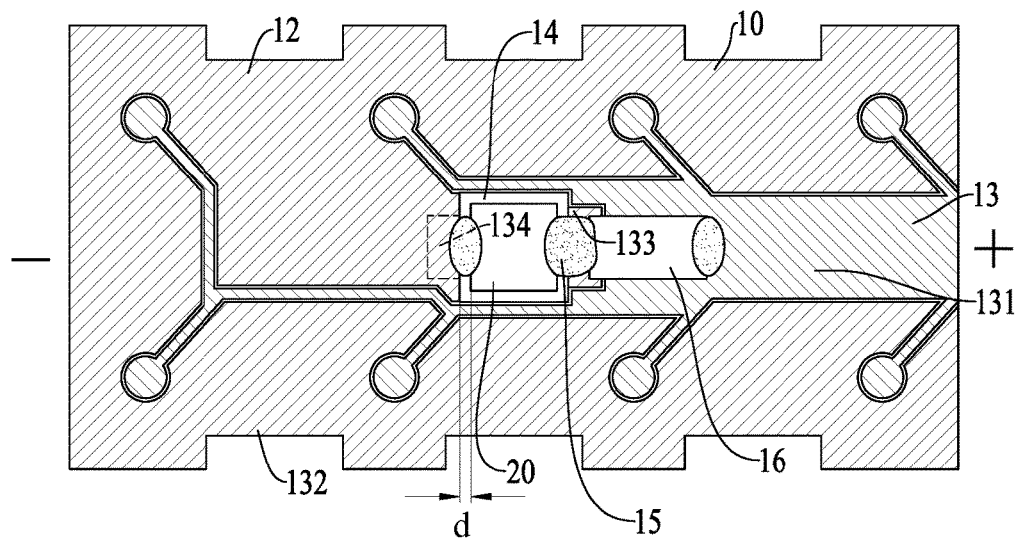
FIGS. 3A and 3B are plain schematic diagrams showing the embedded LED circuit board manufactured by the method according to the first embodiment of the present invention.

With Reference to FIG. 3A, the circuit 13 disposed on the second surface 12 of the circuit substrate 10 includes a positive electrode circuit 131 and a negative electrode circuit 132. Moreover, the circuit 13 disposed on the second surface 12 of the circuit substrate 10 includes a positive soldering point 133 which allows a positive electrode pin of the LED 20 to be connected with the positive electrode circuit 131 by the soldering paste 15 and a negative soldering point 134 which allows a negative electrode pin of the LED 20 to be connected with the negative electrode circuit 132 by the soldering paste 15. The positive electrode circuit 131 is insulated from the negative electrode circuit 132. The positive soldering point 133 can be indirectly electrically connected with the positive electrode circuit 131 by a chip resistor 16, which protects the LED 20.

Figure 3B:
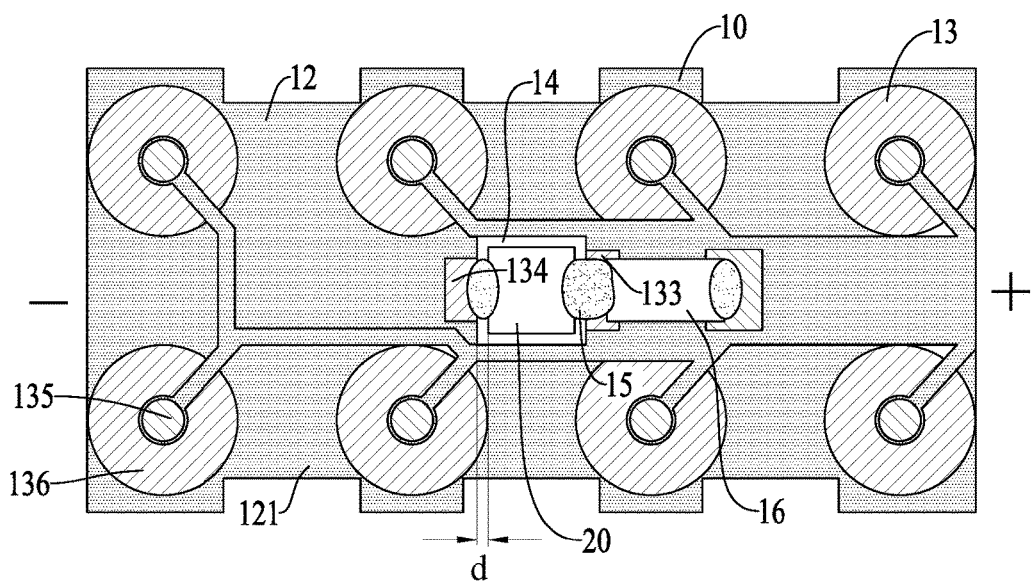

FIG. 3B is a plain view showing the second surface 12 of the circuit substrate 10. The second surface 12 is further coated by an insulating layer 121 partially covering the positive electrode circuit 131 and the negative electrode circuit 132, and exposing a part of the positive electrode circuit 131 as a positive connection points and a looped-shaped part of the negative electrode circuit 132 as a negative connection points 136.

Furthermore, the edges of the positive soldering point 133 and the negative soldering point 134 are aligned with the edges of the through hole 14. When the LED 20 is placed in the through hole 14 of the circuit substrate 10, a gap d is defined between the LED 20 and inner side walls of the through hole 14. The gap d allows the LED 20 to be placed in the through hole 14, but the gap d should not be too large. Because the soldering paste 15 crosses the gap d, the over-sized gap d would result in solder skip during the solidification process in the tin furnace. In order to prevent the poor soldering, the gap d according to the present invention does not exceed 1 mm.

Moreover, because the edges of the positive soldering point 133 and the negative soldering point 134 are aligned with the edges of the through hole 14, the distance between the pins 21 of the LED 20 and the positive soldering point 133 and the negative soldering point 134 is reduced. In other words, the range of printing the soldering paste 15 is reduced and thus the yield rate of the soldering in increased.

Because the LED 20 is disposed in the through hole 14 of the circuit substrate 10, not disposed on the first surface 11 of the circuit substrate 10, the LED 20 is not projected above the first surface 11 of the circuit substrate 10. And, because the circuit substrate 10 and LED 20 are partially overlapped with each other, the overall thickness of the embedded LED circuit board according to the present invention is reduced. Therefore, it is advantageous to assembling the embedded LED circuit board according to the present invention in the electronic devices having limited volume.

Figure 4:
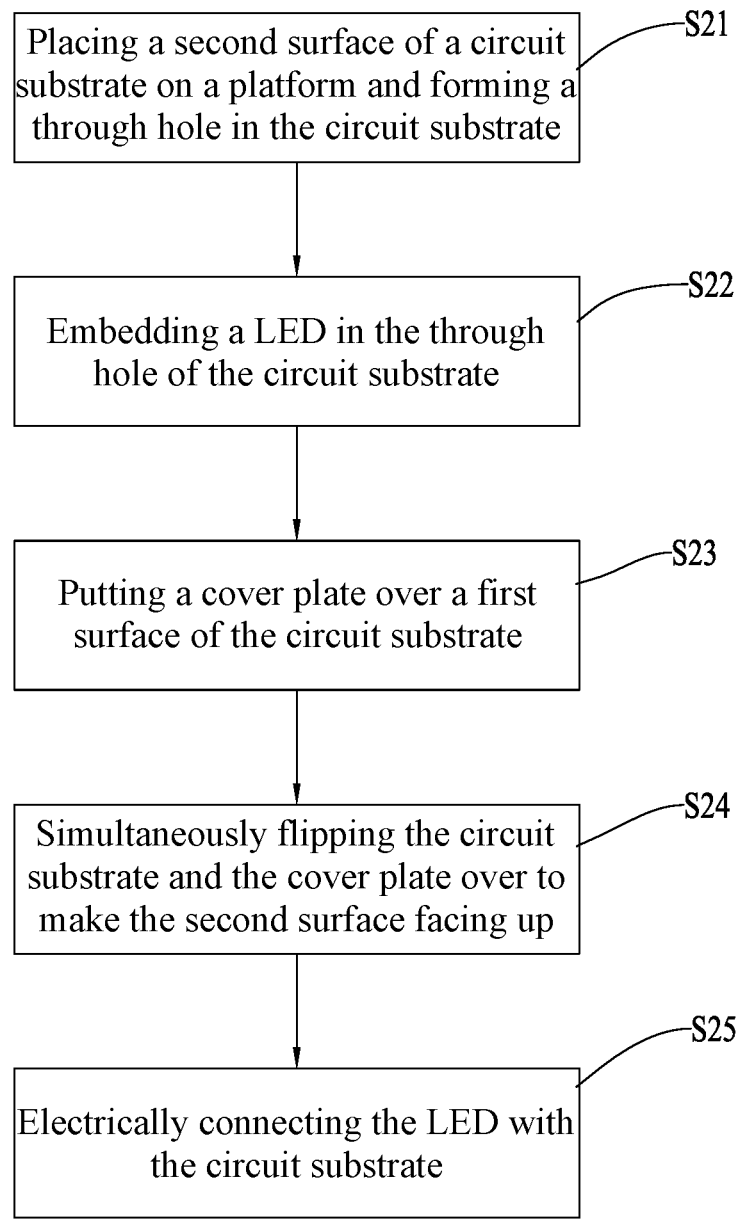
FIG. 4 is a flow chart illustrating a method of manufacturing an embedded LED circuit board according to a second embodiment of the present invention.

Referring FIG. 4, a method of manufacturing an embedded LED circuit board according to a second embodiment of the present invention includes the steps of: placing a second surface 12 of a circuit substrate 10 on a platform with a first surface 11 of the circuit substrate 10 facing up and forming a through hole 14 in the circuit substrate 10 (S21); embedding a light-emitting diode (LED) 20 in the through hole 14 of the circuit substrate 10 (S22); putting a cover plate 30 over the first surface 11 of the circuit substrate 10 (S23); flipping the circuit substrate 10 and the cover plate 30 over and placing the cover plate 30 on the platform to make the second surface 12 facing up (S24); and electrically connecting the LED 20 with the circuit substrate 10 (S25).

Figure 5A:
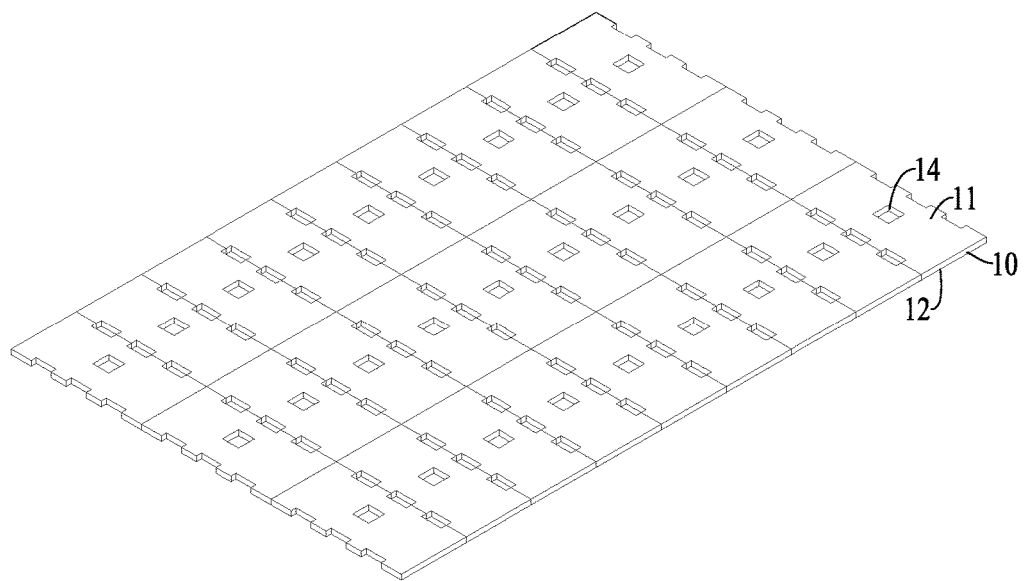
FIGS. 5A to 5D are schematic diagrams showing the method of manufacturing the embedded LED circuit board according to the second embodiment of the present invention.

FIGS. 5A to 5D illustrate the method of manufacturing the embedded LED circuit board according to the second embodiment of the present invention. As shown in FIG. 5A, when manufacturing the embedded LED circuit board, the second surface 12 of the circuit substrate 10 is placed on the platform (not shown in the drawing) with the first surface 11 facing up due to the circuit 13 disposed on the second surface 12 of the circuit substrate 10 and the through hole 14 is then formed in the circuit substrate 10.

Figure 5B:
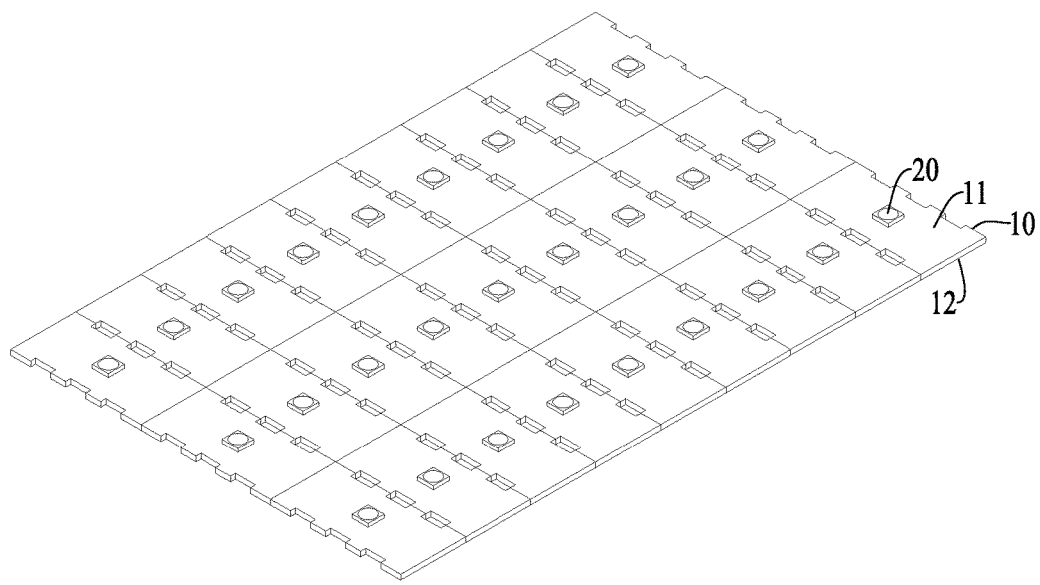

With Reference to FIG. 5B, when embedding the LED 20, the LED 10 is embedded in the through hole 14 of the circuit substrate 10 with the pins 21 (not shown in FIG. 5B) facing down. The LED 20 has a light-emitting front side 22 and a no-light-emitting back side 23 opposite to the light-emitting front side 22. The pins 21 are disposed at the no-light-emitting back side 23 of the LED 20. In other words, the LED 20 is disposed in the through hole 14 of the circuit substrate 10 with the light-emitting front side 22 facing up.

Figure 5C:
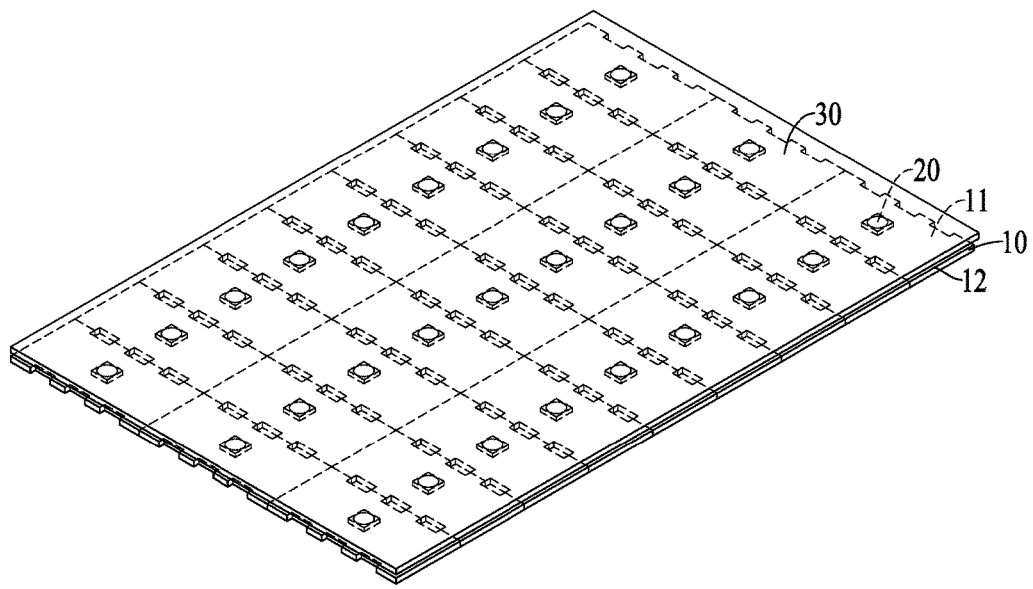

With Reference to FIG. 5C, after the LED 20 is embedded in the through hole 14 of the circuit substrate 10, a cover plate 30 is put on the first surface 11 of the circuit substrate 10 to cover the first surface 11 of the circuit substrate 10 and the LED 20 to prevent the LED 20 from falling off during flipping the circuit substrate 10.

Figure 5D:
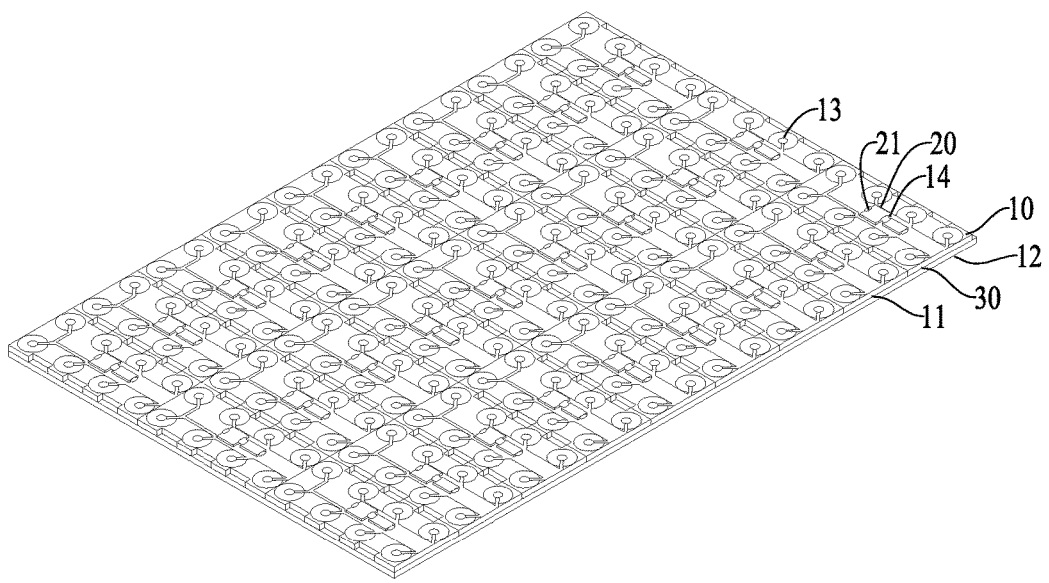
Figure 6:
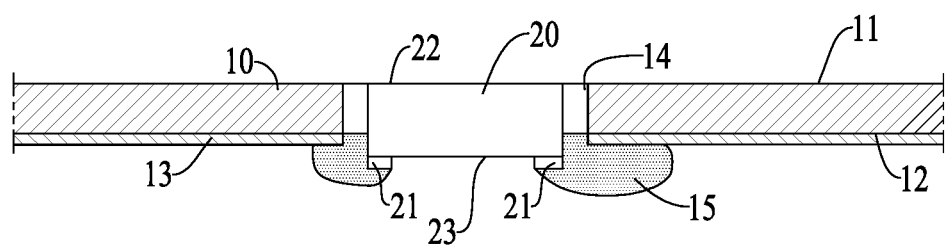
FIG. 6 is a cross-sectional view showing the embedded LED circuit board according to the present invention.

With Reference to FIG. 5D, after the cover plate 30 is put on the first surface 11 of the circuit substrate 10, both of the cover plate 30 and the circuit substrate 10 are flipped over to make the second surface 12 of the circuit substrate 10 facing up. The cover plate 30 and the circuit substrate 10 are placed on the platform with the cover plate 30 facing down. Thus, the second surface 12 of the circuit substrate 10 and pins 21 of the LED 20 face up for the direct soldering, thereby electrically connecting the pins 21 of the LED 20 with the circuit 13 disposed on the second surface 12 of the circuit substrate 10. According to the second embodiment, solder paste 15 is deposited over the pins 21 of the LED 20 and the circuit 13 disposed on the second surface 12 of the circuit substrate 10 by printing. Then, the LED 20 and the circuit substrate 10 is put to a tin furnace to solidify the solder paste 15, thereby soldering the pins 21 of the LED 20 with the circuit 13 disposed on the second surface 12 of the circuit substrate 10 together.

Reference 6 shows the embedded LED circuit board manufactured by the method according to the present invention. The embedded LED circuit board includes the circuit substrate 10 and the LED 20. The circuit substrate 10 includes the first surface 11 and the second surface 12 opposite to the first surface 11. The through hole 14 is formed in the circuit substrate 10 to communicate the first surface 11 and the second surface 12 of the circuit substrate 10. The LED 20 is embedded in the through hole 14 of the circuit substrate 10 and includes two pins 21 electrically connecting with the circuit 13 disposed on the second surface 12 of the circuit substrate 10. The LED 20 includes the light-emitting front side 22 and the no-light-emitting back side 23 opposite to the light-emitting front side 22. The pins 21 are disposed at the no-light-emitting back side 23 of the LED 20. According to the preferred embodiment, the pins 21 are directly disposed on a bottom of the LED 20. Solder paste 15 is deposited over the pins 21 of the LED 20 and the circuit 13 disposed on the second surface 12 of the circuit substrate 10 by printing, thereby soldering the pins 21 of the LED 20 with the circuit 13 disposed on the second surface 12 of the circuit substrate 10 together.

As shown in FIG. 3, the gap d is defined between the LED 20 and the inner side walls of the through hole 14 and the gap d according to the present invention should not exceed 1 mm.

The LED 20 is embedded in the circuit substrate 10 by disposing the LED 20 in the through hole 14 of the circuit substrate 10. Therefore, the overall thickness of the embedded LED circuit board is reduced, and it is advantageous to assembling the embedded LED circuit board according to the present invention in the electronic devices having limited volume.

Figures 7A, 7B:
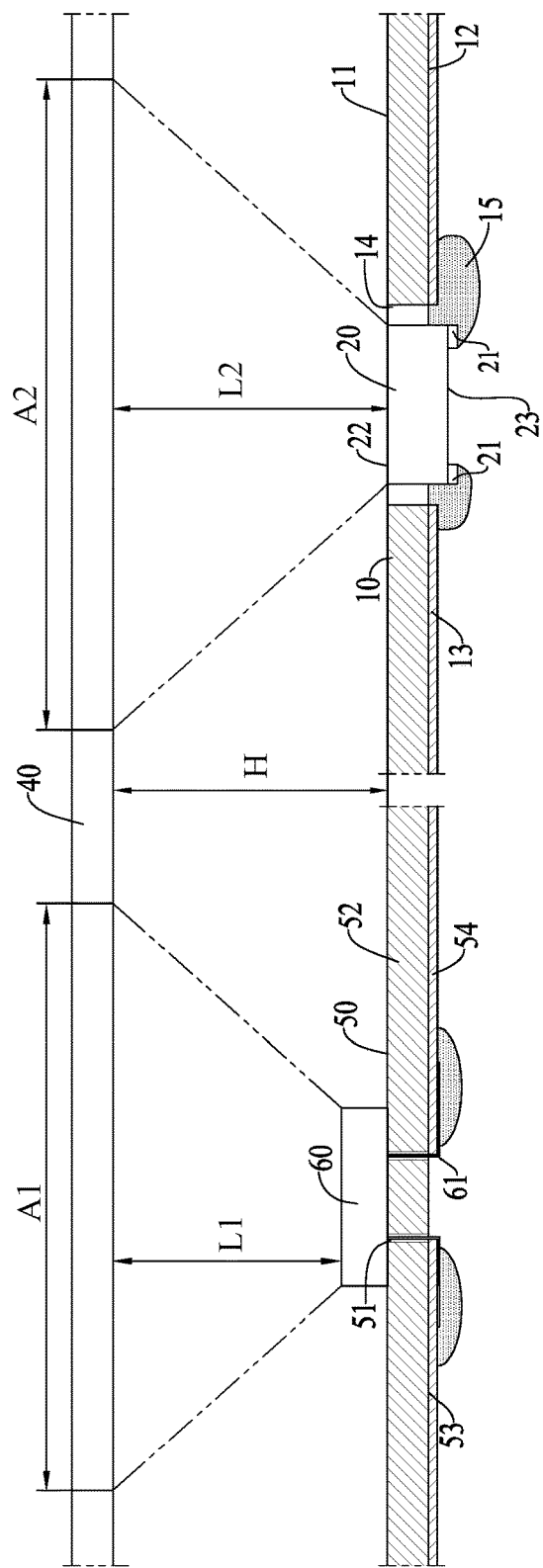
FIG. 7A is a schematic diagram showing a convention LED circuit board in use.
FIG. 7B is a schematic diagram showing the embedded LED circuit board according to the present invention in use.
Figure 8:
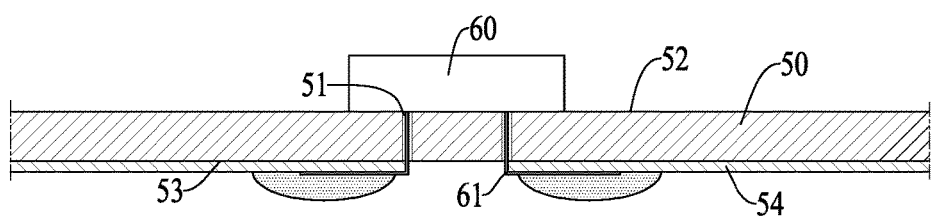
FIG. 8 is a cross-sectional view showing the conventional LED circuit board of FIG. 7A.

FIGS. 7A and 7B show the comparison of the illumination effects between a conventional LED circuit board 50 and the embedded LED circuit board according to the present invention. With Reference to FIG. 7A, the distance between a top surface of a conventional LED circuit board 50 and an object 40 is H and the first distance between a top surface of a LED 60 and the object 40 is L1. The LED 60 emits light to illuminate the object 40 and a first illumination range A1 is formed on the object 40. With Reference to FIG. 7B, the distance between the first surface 11 of the circuit substrate 10 of the embedded LED circuit board according to the present invention and the object 40 is also H. The LED 20 emits light to illuminate the object 40 and a second illumination range A2 is formed on the object 40. Because the LED 20 is imbedded in the circuit substrate 10, the second distance L2 between the LED 20 and the Object 40 is larger than the first distance L1. Therefore, the second illumination range A2 is larger than the first illumination range A1. Accordingly, the embedded LED circuit board according to the present invention has the advantage of having the larger illumination range than the conventional LED circuit board.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method of manufacturing an embedded LED circuit board, comprising the steps of:
    forming a through hole in a circuit substrate, the circuit substrate including a first surface and a second surface opposite to the first surface, the through hole communicating with the first surface and the second surface of the circuit substrate;
    embedding a light-emitting diode (LED) in the through hole of the circuit substrate; and
    electrically connecting two pins of the LED with a circuit disposed on the second surface of the circuit substrate;
    wherein in the step of forming the through hole in the circuit substrate, the first surface of the circuit substrate is placed on a platform with the second surface of the circuit substrate facing up, and in the step of embedding the LED in the circuit substrate, the LED includes a light-emitting front side and a no-light-emitting back side opposite to the light-emitting front side, the two pins are disposed at the no-light-emitting back side of the LED, and the LED is embedded in the through hole of the circuit substrate with the light-emitting front side facing down.

2. The method according to claim 1, wherein in the step of electrically connecting the pins of the LED with the circuit, solder paste is deposited over the pins of the LED and the circuit disposed on the second surface of the circuit substrate by printing and the solder paste is then solidified.

3. The method according to claim 2, wherein a gap is defined between the LED and inner side walls of the through hole and the gap does not exceed 1 mm.

4. An embedded LED circuit board manufactured by the method according to claim 1, the embedding LED circuit board, comprising:
    a circuit substrate including a first surface, a second surface opposite to the first surface, a through hole formed in the circuit substrate to communicate with the first surface and the second surface, and a circuit disposed on the second surface; and
    a light-emitting diode (LED) embedding in the through hole of the circuit substrate and including two pins electrically connected with the circuit disposed on the second surface of the circuit substrate.

5. The embedding LED circuit board according to claim 4, wherein a gap is defined between the LED and inner side walls of the through hole and the gap does not exceed 1 mm.

6. A method of manufacturing an embedded LED circuit board, comprising the steps of:
    forming a through hole in a circuit substrate, the circuit substrate including a first surface and a second surface opposite to the first surface, the through hole communicating with the first surface and the second surface of the circuit substrate;
    embedding a light-emitting diode (LED) in the through hole of the circuit substrate; and
    electrically connecting two pins of the LED with a circuit disposed on the second surface of the circuit substrate;
    wherein in the step of forming the through hole in the circuit substrate, the second surface of the circuit substrate is placed on a platform with the first surface of the circuit substrate facing up;
    in the step of embedding the LED in the circuit substrate, the LED includes a light-emitting front side and a no-light-emitting back side opposite to the light-emitting front side, the two pins are disposed at the no-light-emitting back side of the LED, and the LED is embedded in the through hole of the circuit substrate with the light-emitting front side facing up; and after embedding the LED in the through hole of the circuit substrate, a cover plate is placed over the first surface of the circuit substrate, and the circuit substrate and the cover plate are simultaneously flipped over to make the second surface of the circuit substrate facing up.

* * * * *